(12) United States Patent
Park

(10) Patent No.: US 8,643,088 B2
(45) Date of Patent: Feb. 4, 2014

(54) SEMICONDUCTOR DEVICE AND METHOD FOR FORMING THE SAME

(75) Inventor: Jin Won Park, Seongnam (KR)

(73) Assignee: Hynix Semiconductor Inc., Icheon (KR)

( * ) Notice: Subject to any disclaimer, the term of this patent is extended or adjusted under 35 U.S.C. 154(b) by 118 days.

(21) Appl. No.: 12/957,100

(22) Filed: Nov. 30, 2010

(65) Prior Publication Data

US 2012/0001255 A1  Jan. 5, 2012

(30) Foreign Application Priority Data

Jul. 1, 2010 (KR) .................. 10-2010-0063424

(51) Int. Cl.
| | |
|---|---|
| *H01L 29/76* | (2006.01) |
| *H01L 29/94* | (2006.01) |
| *H01L 31/062* | (2012.01) |
| *H01L 31/113* | (2006.01) |
| *H01L 23/34* | (2006.01) |

(52) U.S. Cl.
USPC ........... 257/329; 257/330; 257/368; 257/713; 257/331

(58) Field of Classification Search
USPC ........... 257/329, 302, 330, 331, 333, 135, 93, 257/334, 368, 446, 491, 663, 713
See application file for complete search history.

(56) References Cited

U.S. PATENT DOCUMENTS

| | | | |
|---|---|---|---|
| 2007/0051997 A1* | 3/2007 | Haller et al. | 257/302 |
| 2009/0163027 A1 | 6/2009 | Yi | |
| 2010/0117141 A1* | 5/2010 | Shin et al. | 257/326 |

* cited by examiner

*Primary Examiner* — Chuong A. Luu

(57) ABSTRACT

The present invention relates to a semiconductor device and a method of manufacture thereof, particularly, to a semiconductor device including a vertical type gate and a method of forming the same. According to the present invention, a semiconductor device includes a vertical pillar which is protruded from a semiconductor substrate, has a vertical channel, and has a first width; an insulating layer which has a second width smaller than the first width, provided in both sides of the vertical pillar which is adjacent in a first direction; and a nitride film provided in a side wall of the insulating layer.

17 Claims, 5 Drawing Sheets

SEMICONDUCTOR DEVICE AND METHOD FOR FORMING THE SAME

CROSS-REFERENCES TO RELATED APPLICATIONS

The present application claims priority to Korean patent application number 10-2010-0063424, filed on Jul. 1, 2010, which is incorporated by reference in its entirety.

BACKGROUND OF THE INVENTION

The present invention relates to a semiconductor device and a method of forming the same, more particularly, to a semiconductor device including a vertical type gate and a method of forming the same.

Recently, 40 nm memory devices are required to be further scaled down. A planner or a recessed gate transistor employing 8F2 (F: minimum feature size) or 6F2 type as a unit cell size is very difficult to be scaled down under 40 nm. A DRAM device employing a 4F2 unit cell can improve the integration density 1.5~2 times compared to 8F2 or 6F2 unit cell size. Accordingly, the vertical channel transistor is suggested to embody a 4F2 unit cell.

The vertical channel transistor is a transistor in which the channel is orthogonally formed in respect to a surface of a substrate, rather than in parallel thereto. Accordingly, it is not restricted by the channel length although the area of transistor is reduced.

In a vertical channel transistor, a gate electrode is formed around an active pillar which is orthogonally extending from a semiconductor substrate, and source/drain areas are formed at an upper portion and a lower portion of the active pillar so that a channel is orthogonally formed with respect to the surface of the semiconductor substrate. Accordingly, the channel can have a relatively large length although a unit cell size of a transistor is reduced.

BRIEF SUMMARY OF THE INVENTION

Embodiments of the present invention are directed to solve the problem of degrading characteristics of a semiconductor device, when the edge of a vertical pillar is pointed to form a cusp in the formation of a gate oxidation film of the semiconductor device including a vertical type gate.

According to an embodiment of the present invention, a semiconductor device includes a vertical pillar protruded from a semiconductor substrate, the vertical pillar having a first width and defining a vertical channel; an insulating layer having a second width smaller than the first width, the insulting layer provided at first and second sidewalls of the vertical pillar, the first and second sidewalls arranged along a first direction and facing each other; and a nitride film provided over the insulating layer. The insulating layer is an oxide film. The nitride film has a width that is substantially the same as first width. The nitride film has an etch selectivity different from that of the insulating layer.

In accordance with an embodiment of the present invention, a semiconductor device further includes a bit line formed between the vertical pillars and extending a second direction orthogonal to the first direction. In accordance with an embodiment of the present invention, a semiconductor device further includes an interlayer insulating film filling in a space between neighboring vertical pillars arranged along the first direction. The interlayer insulating film includes an oxide film. The interlayer insulating film has substantially the same width as the insulating layer. A plurality of sidewalls of the vertical pillar are exposed by the insulating layer having the second width.

In accordance with an embodiment of the present invention, a semiconductor device further includes a gate oxidation film formed on the vertical pillar exposed by the insulating layer. The gate oxidation film is formed substantially orthogonal to the sidewalls of the vertical pillar.

According to another embodiment of the present invention, a semiconductor device includes a vertical pillar protruded from a surface of a semiconductor substrate, the vertical pillar having a first width and defining a vertical channel; and an insulating layer which has a second width smaller than the first width, the insulating layer being provided at first and second sidewalls of the vertical pillar, the first and second sidewalls arranged along a first direction and facing each other. The insulating layer is an oxide film. A plurality of sidewalls the vertical pillar are exposed by the insulating layer having the second width.

According to an embodiment of the present invention, a method of manufacturing a semiconductor device includes etching a semiconductor substrate in a second direction to form a silicon line pattern; forming an insulating layer over a sidewall of the silicon line pattern; forming a nitride film over the insulating layer; etching the silicon line pattern, the insulating layer and the nitride film in a first direction orthogonal to the second direction; and etching the insulating layer exposed in the first direction. The insulating layer is an oxide film.

In accordance with an embodiment of the present invention, a method of manufacturing a semiconductor device further includes forming a bit line between the silicon line pattern. In accordance with an embodiment of the present invention, after forming a nitride film, a method of manufacturing a semiconductor device further includes forming an interlayer insulating film filling in a space between the silicon line patterns arranged along the second direction. The insulating layer is etched so as to have a width smaller than the width of the vertical pillar. Etching the insulating layer film is etched together with the interlayer insulating layer. Etching the insulating layer is performed by a wet etching. Etching the insulating layer is performed by using a wet solution including HF. A plurality of edges of the vertical pillar is exposed by etching the insulating layer.

In accordance with an embodiment of the present invention, after etching the insulating layer, a method of manufacturing a semiconductor device further includes forming a gate oxidation film on the vertical pillar exposed by the insulating layer.

According to another embodiment of the present invention, a semiconductor device includes a vertical pillar extending outward from a surface of a semiconductor substrate, a first gate insulating layer formed over a sidewall of the vertical pillar while exposing an edge of the vertical pillar and a second gate insulating layer extending from the first gate insulating layer to the edge of the vertical pillar. The second gate insulating layer substantially defines a right angle at the edge of the vertical pillar. The first and the second insulating layers include substantially the same material. The vertical pillar pattern has a first width and the first gate insulating pattern has a second width, the second width being smaller than the first width.

The present invention provides an effect of solving the problem of degrading characteristics of a semiconductor device when the edge of a vertical pillar is pointed to form a cusp in the formation of a gate oxidation film of the semiconductor device including a vertical type gate.

DESCRIPTION OF EMBODIMENTS

Hereinafter, embodiments of the present invention will be illustrated in detail with reference to drawings.

Figure 1:
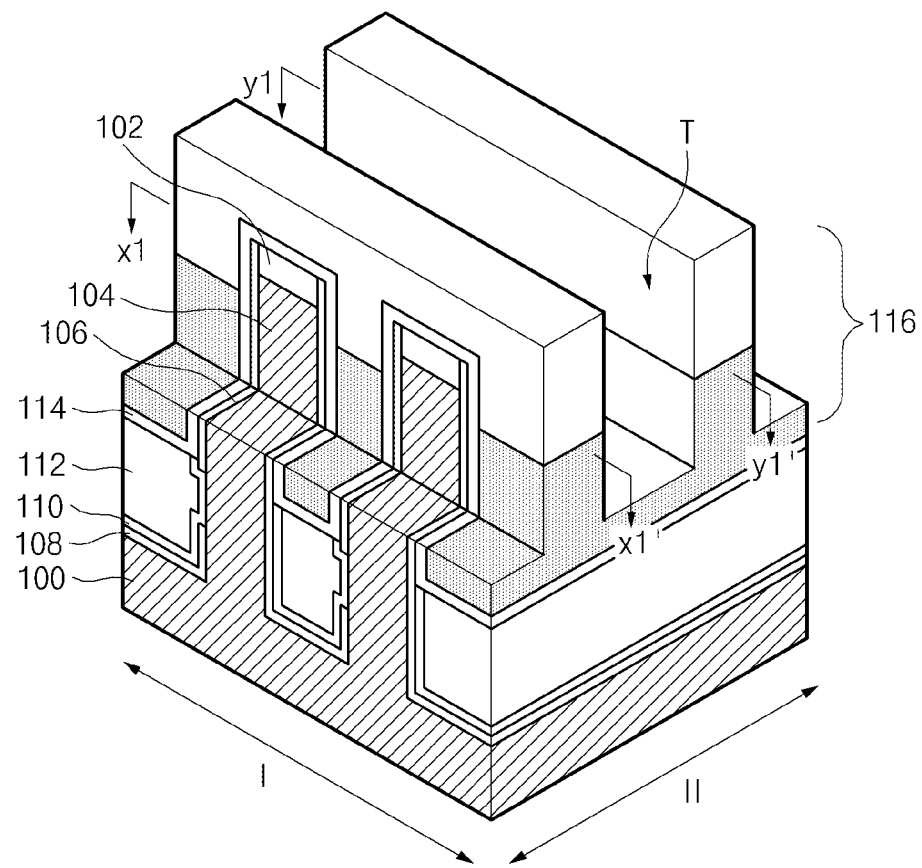
FIG. 1 is a perspective view of a semiconductor device before oxidizing a vertical pillar according to an embodiment of the present invention.

As shown in FIG. 1, a semiconductor device according to an embodiment of the present invention includes a vertical pillar 104 which is formed to be protruded from a semiconductor substrate 100, a bit line 112 which is formed in the lower portion of a space between the vertical pillar 104 which are arranged along a first direction I and extended to a second direction II orthogonal to the first direction I, a trench T provided between the vertical pillars 104 which are arranged along the second direction II, an oxide film 106 provided at both sides of the vertical pillar 104 along the first direction I while being recessed (R) by a given depth, and a liner oxidation film (or nitride film) 108 provided at a side wall of the oxide film 106.

In addition, the semiconductor device further includes an interlayer insulating film 116 which fills in the space between adjacent vertical pillars 104 arranged along the first direction I and extended along the second direction II. It is preferable that the interlayer insulating film 116 is an oxide film. It is preferable that the vertical pillar 104 has a vertical channel which is activated by a gate (not shown) provided at both sides of the vertical pillar arranged along the first direction I.

Figure 2:
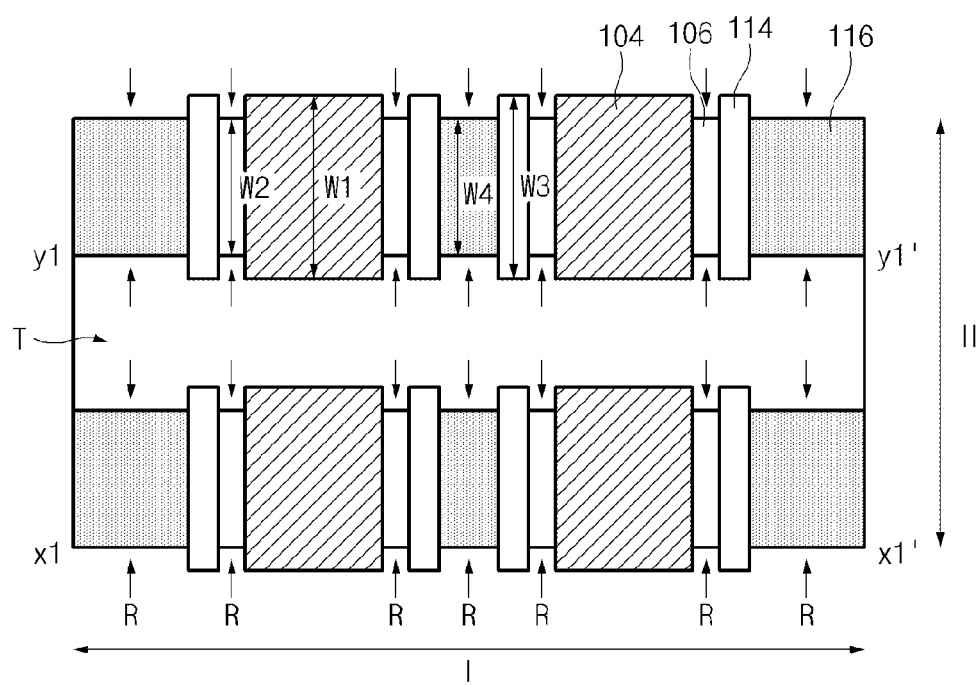
FIG. 2 is a plan view of the semiconductor device taken along lines x1-x1' and y1-y1' of FIG. 1 before oxidizing the vertical pillar according to an embodiment of the present invention.

The plan view taken along lines x1-x1' and y1-y1' of the above-described perspective view is as follows. As shown in FIG. 2, a hard mask pattern 102 (not shown) extending to the second direction II is formed on the semiconductor substrate 100. The semiconductor substrate 100 is etched with the hard mask pattern 102 (refer to FIG. 4) as an etching mask to form silicon line patterns arranged along the first direction I with a gap between each other. The upper portion of the silicon line pattern defines the vertical pillar 104 along with a trench T formed in the subsequent processes. The trench T is formed along the second direction II and extending to the first direction I Then, an oxide film 106 is formed on a first and a second sidewall of the silicon line pattern arranged along the first direction I. A liner oxidation film 108 extends from the oxide film 106 on the first sidewall of the silicon line pattern while leaving a space between the oxide film 106 and the liner oxidation film 108. The liner oxidation film 108 can extend over the substrate in the gap between the silicon line patterns. The space partly exposes the first sidewall of the silicon line pattern. A barrier metal layer 110 is formed over the first sidewall of the silicon line patterns through the space and may extend upward over the oxide film 106 and downward over the liner oxidation film 108. A conductive material fills in the gap between the silicon line patterns to form a bit line 112. The bit line 112 is formed over the barrier metal layer 110 so as to at least partly cover the window. A nitride film 114 is formed over the oxide film 106 at the first and the second sidewalls of the silicon line pattern. Then, an interlayer insulating film 116 is formed over the nitride film 114 while filling in the gap between the silicon line patterns arranged along the first direction I. Then, the silicon line pattern and the interlayer insulating film 116 are etched along the direction I to form the vertical pillars 104 and the trench T. The trench T is between the vertical pillars 104 and arranged along the direction II.

Then, a recess R is formed by wet-etching the oxide film 106. It is preferable that the wet etching is performed by using an etchant containing HF. The etchant containing HF is used to selectively etch the oxide film 106. In this process, when the interlayer insulating film 116 is an oxide film, the interlayer insulating film 116 can be etched together and recessed with the oxide film 116.

By the generation of the recess R which is formed by selectively etching the oxide film 106, four edges of the vertical pillar 104 are exposed. In the case where a gate oxide layer is formed on the vertical pillar 104 without the recess R, a cusp-like gate oxidation film is formed at the edge portion of the vertical pillar 104. Using the recess R, a gate oxide film can be formed of a uniform thickness.

It is preferable that a width W1 of the vertical pillar 104 is substantially same as a width W3 of the nitride film 114. The width W2 of the oxide film 106 is smaller by the recess R than the width of the vertical pillar 104 W1 or the width of the nitride film 114 W3. It is preferable that the width W4 of the interlayer insulating film 116 is as substantially same as the width of the oxide film W2.

Figure 3:
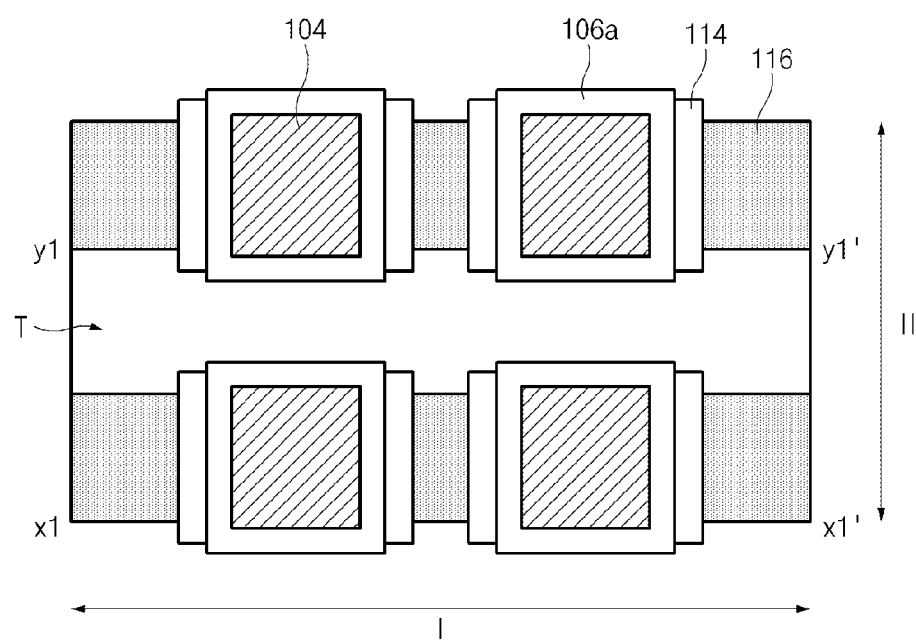
FIG. 3 is a plan view of the semiconductor device taken along lines x1-x1' and y1-y1' of FIG. 1 after oxidizing the vertical pillar according to an embodiment of the present invention.

As shown in FIG. 3, the vertical pillar 104 exposed by the oxide film 106 is oxidized to form a gate oxidation film 106a. The gate oxidation film 106a is formed on the vertical pillar 104 exposed by the oxide film 106. However, since the oxide film 106 and the gate oxidation film 106a are formed of the same material, i.e., silicon oxide, they are shown in one piece in FIG. 3. It is preferable that the gate oxidation film 106a is formed with a uniform thickness from the surface of the vertical pillar 104 exposed by the oxide film 106. Hence, the edge of the vertical pillar 104 forms a right angle rather than a cusp so as to prevent the characteristics of the semiconductor device from being deteriorated.

The present invention is not limited to the above-described embodiment and can be changed to another exemplary embodiment. The semiconductor device of another exemplary embodiment of the present invention is a semiconductor device of the state where the bit line and the nitride film provided in the side wall of the vertical pillar for the electrical insulation of the gate formed at subsequent processes are removed. The semiconductor device according to another embodiment of the present invention is illustrated with reference to FIGS. 4 and 5 which has no nitride film 114 between the gate oxidation film 106a and the interlayer insulation film 116.

Figure 4:
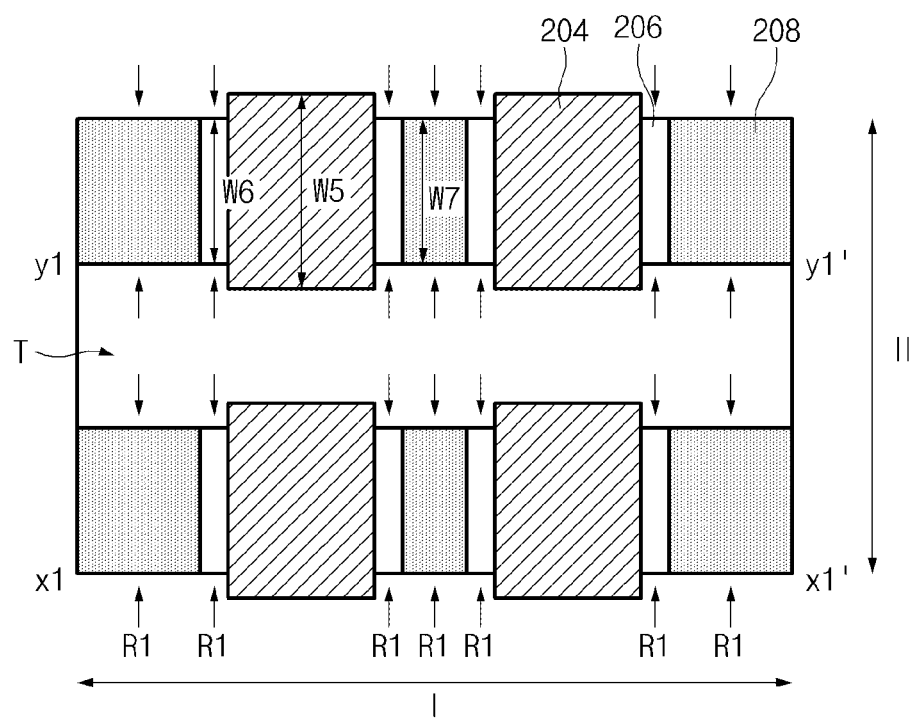
FIG. 4 is a plan view of the semiconductor device taken along lines x1-x1' and y1-y1' of FIG. 1 before oxidizing the vertical pillar according to another embodiment of the present invention.

As shown in FIG. 4, an oxide film 206 is provided at side walls of the vertical pillar 204, and an interlayer insulating film 208 is provided over the oxide film 206. The width W6 of the oxide film 206 is smaller by the recess R1 than the width W5 of the vertical pillar 204 so that four edges of the vertical pillar 204 are exposed. It is preferable that the width W6 of the oxide film 206 and the width W7 of the interlayer insulating film 208 are substantially the same in cases where the interlayer insulating film 208 is formed of the same material as the oxide film 208, i.e., an oxide film.

Figure 5:
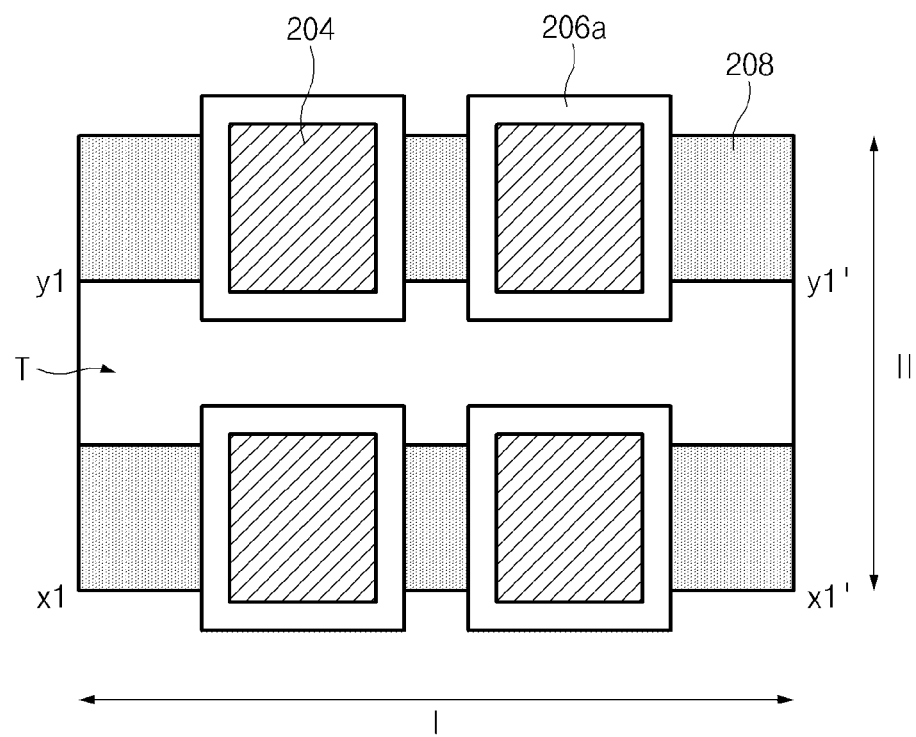
FIG. 5 is a plan view of the semiconductor device taken along lines x1-x1' and y1-y1' of FIG. 1 after oxidizing the vertical pillar according to another embodiment of the present invention.

As shown in FIG. 5, a gate oxidation film 206a is formed on the exposed vertical pillar 204. Since the oxide film on the side walls of the vertical pillar 204 is formed of the same material of the gate oxidation film 206a, they are shown in one piece in FIG. 5. Since the gate oxidation film 206a is formed with a uniform thickness, the edge of the vertical pillar 204, forms a right angle rather than a cusp. Thus, the characteristics of the semiconductor device can be prevented from being deteriorated.

As described above, in the case of forming the gate oxidation film on the vertical pillar, the present invention exposes four edges of the vertical pillar and forms a gate oxidation film with a uniform thickness, especially at edge portions. Thus, any disadvantage caused due to a gate oxide film which is non-uniformly thick can be prevented.

It will be apparent to those skilled in the art that various modifications and variations can be made to the aforementioned embodiments without departing from the spirit or scope of the invention. Thus, it is intended that the present invention cover the modifications and variations of the embodiments provided they come within the scope of the appended claims and their equivalents.

What is claimed is:

1. A semiconductor device, comprising:
a vertical pillar protruded from a semiconductor substrate, the vertical pillar having a first width and defining a vertical channel;
an insulating layer having a second width smaller than the first width, the insulating layer provided over first and second sidewalls of the vertical pillar, the first and second sidewalls arranged along a first direction and facing each other; and
a nitride film provided at sidewalls of the insulating layer, wherein each corner the vertical pillar is exposed by the insulating layer having the second width.

2. The semiconductor device of claim 1, wherein the insulating layer includes an oxide film.

3. The semiconductor device of claim 1, wherein the nitride film has a width that is substantially the same as the first width.

4. The semiconductor device of claim 1, wherein the nitride film has an etch selectivity different from that of the insulating layer.

5. The semiconductor device of claim 1, further comprising a bit line formed between the vertical pillars and extending along a second direction orthogonal to the first direction.

6. The semiconductor device of claim 1, further comprising an interlayer insulating film filling in a space between neighboring vertical pillars arranged along the first direction.

7. The semiconductor device of claim 6, wherein the interlayer insulating film includes an oxide film.

8. The semiconductor device of claim 6, wherein the interlayer insulating film has substantially the same width as the insulating layer.

9. The semiconductor device of claim 1, further comprising a gate oxidation film formed on the vertical pillar exposed by the insulating layer.

10. The semiconductor device of claim 9, wherein the gate oxidation film is formed substantially orthogonal to the sidewalls of the vertical pillar.

11. A semiconductor device, comprising:
a vertical pillar protruded from a surface of a semiconductor substrate, the vertical pillar having a first width and defining a vertical channel; and
an insulating layer which has a second width smaller than the first width, the insulating layer being provided over first and second sidewalls of the vertical pillar, the first and second sidewalls arranged along a first direction and facing each other,
wherein each corner of the vertical pillar is exposed by the insulating layer having the second width.

12. The semiconductor device of claim 11, wherein the insulating layer includes an oxide film.

13. The semiconductor device of claim 11, wherein a plurality of sidewalls of the vertical pillar are exposed by the insulating layer having the second width.

14. A semiconductor device, comprising:
a vertical pillar extending outward from a surface of a semiconductor substrate;
a first gate insulating layer formed over a sidewall of the vertical pillar while exposing each corner of the vertical pillar; and
a second gate insulating layer formed over the exposed vertical pillar.

15. The semiconductor device of claim 14, wherein the second gate insulating layer substantially defines a right angle at each corner of the vertical pillar.

16. The semiconductor device of claim 14, wherein the first and the second insulating layers include substantially the same material.

17. The semiconductor device of claim 14, wherein the vertical pillar pattern has a first width and the first gate insulating pattern has a second width, the second width being smaller than the first width.

* * * * *